(12) United States Patent
Yong et al.

(10) Patent No.: US 7,608,986 B2
(45) Date of Patent: Oct. 27, 2009

(54) QUARTZ CRYSTAL RESONATOR

(75) Inventors: Yook-Kong Yong, Princeton, NJ (US); Mihir S Patel, Highland Park, NJ (US); Masako Tanaka, Okaya (JP)

(73) Assignees: Seiko Epson Corporation, Tokyo (JP); Rutgers, State University of New Jersey, New Brunswick, NJ (US)

( * ) Notice: Subject to any disclaimer, the term of this patent is extended or adjusted under 35 U.S.C. 154(b) by 45 days.

(21) Appl. No.: 11/537,920

(22) Filed: Oct. 2, 2006

(65) Prior Publication Data

US 2008/0079334 A1 Apr. 3, 2008

(51) Int. Cl.
*H01L 41/053* (2006.01)
*H01L 41/18* (2006.01)

(52) U.S. Cl. .................. 310/360; 310/346; 310/361

(58) Field of Classification Search .......... 310/346, 310/360, 361
See application file for complete search history.

(56) References Cited

U.S. PATENT DOCUMENTS

| | | | | |
|---|---|---|---|---|
| 5,198,716 A | * | 3/1993 | Godshall et al. | 310/349 |
| 5,302,879 A | * | 4/1994 | Totty et al. | 310/361 |
| 5,473,216 A | * | 12/1995 | Brosig et al. | 310/346 |
| 5,571,363 A | * | 11/1996 | Brosig et al. | 156/292 |
| 5,847,489 A | * | 12/1998 | Satoh et al. | 310/348 |
| 6,172,443 B1 | * | 1/2001 | Branham | 310/313 A |
| 6,880,407 B2 | * | 4/2005 | Yamanaka et al. | 73/778 |
| 2002/0180315 A1 | * | 12/2002 | Tanaka et al. | 310/348 |
| 2003/0080819 A1 | * | 5/2003 | Jiles et al. | 331/176 |
| 2006/0192464 A1 | | 8/2006 | Tanaka et al. | |

FOREIGN PATENT DOCUMENTS

| | | | | |
|---|---|---|---|---|
| FR | 2547458 | * | 12/1984 | 310/346 |
| GB | 2202989 A | * | 10/1988 | |
| JP | A 2000-68780 | | 3/2000 | |
| JP | A 2006-157369 | | 6/2006 | |
| JP | A 2006-238263 | | 9/2006 | |

* cited by examiner

*Primary Examiner*—Thomas M Dougherty
(74) *Attorney, Agent, or Firm*—Oliff & Berridge, PLC

(57) ABSTRACT

A quartz crystal resonator includes a quartz crystal resonator element having a main surface including an X axis (electrical axis) and a Z' axis of an inclination rotated at an angle (y) equal to or greater than 36.4 degrees and equal to or smaller than, 40.5 degrees from a Z axis (optical axis) around the X axis, a main vibrating portion vibrating at a predetermined resonance frequency (f) and a supporting portion integrally formed with the main vibrating portion in such a manner as to be formed peripherally to surround the main vibrating portion, and two covers having a thermal expansion coefficient equal to or greater than $6\times10^{-6}$ per degrees centigrade and equal to or smaller than $10\times10^{-6}$ per degrees centigrade and bonded to the supporting portion so as to sandwich the quartz crystal resonator element therebetween.

10 Claims, 9 Drawing Sheets

QUARTZ CRYSTAL RESONATOR

BACKGROUND

1. Technical Field

The present invention relates to a quartz crystal resonator in which a quartz crystal resonator element has a main vibrating portion integrally formed with a supporting portion and is covered with casings of glass or the like.

2. Related Art

The recent trend toward smaller and thinner electronic equipment requires smaller and thinner designs of quartz crystal resonators incorporated therein. For the purpose of reducing the size and thickness of a quartz crystal resonator, for example, Japanese Patent No. 3390348 and JP-A-2006-157369 have disclosed a structure of a quartz crystal resonator (which is called a chip size package (CSP) quartz crystal resonator).

Referring to FIG. 16, a description will be given of the above quartz crystal resonator. FIG. 16 is a front sectional view showing an AT-cut quartz crystal resonator using a quartz crystal substrate, as an example of the well-known quartz crystal resonator.

A quartz crystal resonator 500 is comprised of a quartz crystal resonator element 505 and first and second casings 506 and 507 as covers provided so as to sandwich and cover the quartz crystal resonator element 505. The quartz crystal resonator element 505 is constituted using a quartz crystal substrate (which is called an AT-cut quartz crystal substrate) having a plane including an X axis (electrical axis) as a crystallographic axis of a quartz crystal and a Z' axis having an inclination of approximately 35.25 degrees from a Z axis (optical axis) around the X axis.

In the quartz crystal resonator element 505, a main vibrating portion 501, which has excitation electrodes 503 and 504 formed on upper and lower surfaces thereof, is integrally formed with a supporting portion 502 provided so as to surround the main vibrating portion 501.

The first and second casings 506 and 507 are, for example, made of versatile glass such as blue plate glass. The first and second casings 506 and 507 have peripherally-formed protrusions 508 and 509, respectively, at outer peripheries thereof. The first and second casings 506 and 507 are bonded to the supporting portion 502 at the protrusions 508 and 509 so as to sandwich the quartz crystal resonator element 505 therebetween.

However, in the above quartz crystal resonator 500, a thermal expansion coefficient of the quartz crystal resonator element 505 is different from that of the first and second casings 506 and 507. Accordingly, there is a variation in the amount of expansion caused due to changes in environmental temperature. For example, a thermal expansion coefficient in the X-axis direction of a quartz crystal is $19.7 \times 10^{-6}$ per degrees centigrade, whereas that of blue plate glass is $8.1 \times 10^{-6}$ per degrees centigrade.

Environmental temperature changes will cause a thermal stress because of a difference between the amounts of expansions at places where the supporting portion 502 has been bonded to each of the protrusions 508 and 509. The thermal stress affects a resonance frequency of the quartz crystal resonator 500 using the above-mentioned AT-cut crystal substrate. Therefore, there arises a so-called problem that frequency-temperature characteristics are deteriorated.

SUMMARY

The present invention has been made in view of the above problem. An advantage of the present invention is to provide a quartz crystal resonator that does not cause deterioration of frequency-temperature characteristics thereof even when environmental temperature changes occur.

In order to solve the problem described above, a quartz crystal resonator according to an aspect of the invention includes a quartz crystal resonator element having a main surface including an X axis (electrical axis) and a Z' axis of an inclination rotated at an angle (y) equal to or greater than 36.4 degrees and equal to or smaller than 40.5 degrees from a Z axis (optical axis) around the X axis, a main vibrating portion vibrating at a predetermined resonance frequency (f) and a supporting portion integrally formed with the main vibrating portion in such a manner as to be formed peripherally to surround the main vibrating portion, and two covers having a thermal expansion coefficient equal to or greater than $6 \times 10^{-6}$ per degrees centigrade and equal to or smaller than $10 \times 10^{-6}$ per degrees centigrade and bonded to the supporting portion so as to sandwich the quartz crystal resonator element therebetween.

In the quartz crystal resonator according to the above aspect of the invention, a combination of a cut angle for cutting out a quartz crystal resonator element and a thermal expansion coefficient of the two covers within the above-mentioned range allows reduction in the deterioration of frequency-temperature characteristics even at environmental temperature changes. Consequently, the quartz crystal resonator can have excellent frequency-temperature characteristics.

In addition, since a commonly-used glass such as blue plate glass can be used as the covers, casings for the covers can be prepared at low cost. Use of such low-cost casings enables manufacturing of a low-cost quartz crystal resonator.

Furthermore, preferably, each of the two covers has a protruding portion formed peripherally thereon in such a manner as to roughly oppose the supporting portion, and the protruding portion is bonded to the supporting portion.

In this manner, the protruding portions of the two covers are bonded to the supporting portion of the quartz crystal resonator element, so that spaces can be provided between the main vibrating portion of the quartz crystal resonator element opposing parts excepting the protruding portions and the two covers. Consequently, the two covers do not disturb vibration of the main vibrating portion of the quartz crystal resonator element, and thus, for example, vibration characteristics such as a CI value and frequency characteristics obtained are excellent.

Furthermore, in this quartz crystal resonator, preferably, a circuit section including an oscillation circuit for the quartz crystal resonator element is provided on a surface of at least one of the two covers to be connected to the quartz crystal resonator element.

In this manner, even when a thermal expansion coefficient of the circuit section is greatly different from that of the quartz crystal resonator element, the covers can absorb deformation of the circuit section caused due to temperature changes. Consequently, even when temperature changes occur, it can be prevented that influence of deformation of the circuit section will reach even to the quartz crystal resonator element.

Additionally, in the quartz crystal resonator according to the aspect of the invention, preferably, the supporting portion has a protrusion formed so as to be protruded from the main surface at each of upper and lower sides of the resonator element, and an upper surface of the protrusion is bonded to each of the two covers.

In this manner, since the quartz crystal resonator element is bonded to the two covers by the protrusions formed so as to be protruded from the main surfaces, spaces can be provided between the main vibrating portion of the quartz crystal resonator element and the two covers. Therefore, the two covers do not disturb vibration of the main vibrating portion of the quartz crystal resonator element, and thus, for example, vibration characteristics such as a CI value and frequency characteristics obtained is excellent.

Additionally, in the above quartz crystal resonator, preferably, a circuit section including an oscillation circuit for the quartz crystal resonator element is provided on a surface of at least one of the two covers to be connected to the quartz crystal resonator element.

In this manner, even when a thermal expansion coefficient of the circuit section is greatly different from that of the quartz crystal resonator element, the covers can absorb deformation of the circuit section caused due to temperature changes. Consequently, even when temperature changes occur, it can be prevented that influence of deformation of the circuit section will reach even to the quartz crystal resonator element.

Furthermore, in the quartz crystal resonator according to the above aspect of the invention, preferably, the quartz crystal resonator element has a recessed groove formed on at least one main surface thereof in such a manner as to surround the main vibrating portion.

In this manner, forming the recessed groove can prevent vibration leakage of the main vibrating portion to the supporting portion. Therefore, in addition to the above effectiveness of reducing temperature characteristics, the invention can prevent deterioration of frequency-temperature characteristics due to the vibration leakage. Consequently, higher-precision frequency-temperature characteristics can be obtained.

Furthermore, in this quartz crystal resonator, preferably, a circuit section including an oscillation circuit for the quartz crystal resonator element is provided on a surface of at least one of the two covers to be connected to the quartz crystal resonator element.

In this manner, even when a thermal expansion coefficient of the circuit section is greatly different from that of the quartz crystal resonator element, the covers can absorb deformation of the circuit section caused due to temperature changes. Consequently, even when temperature changes occur, it can be prevented that influence of deformation of the circuit section will reach even to the quartz crystal resonator element.

Additionally, in the quartz crystal resonator according to the above aspect of the invention, preferably, a relationship between the angle (y) and the resonance frequency (f) is expressed as a formula: $y=-1.731 \times 10^{-4} f^2 + 5.435 \times 10^{-2} f + 3.623 \times 10 \pm 0.75$.

In this manner, higher-precision frequency-temperature characteristics can be obtained.

Furthermore, in the quartz crystal resonator according to the above aspect of the invention, preferably, a relationship between the angle (y) and an X-side ratio (x) as a length-to-thickness ratio of a side roughly along the X axis is expressed as a formula: $y=-2.547 \times 10^{-4} x^2 + 6.314 \times 10^{-2} x + 3.597 \times 10^1 \pm 0.75$.

In this manner, higher-precision frequency-temperature characteristics can be obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Exemplary embodiments of the invention will be described hereinafter with reference to the accompanied drawings.

FIRST EMBODIMENT

Figure 1:
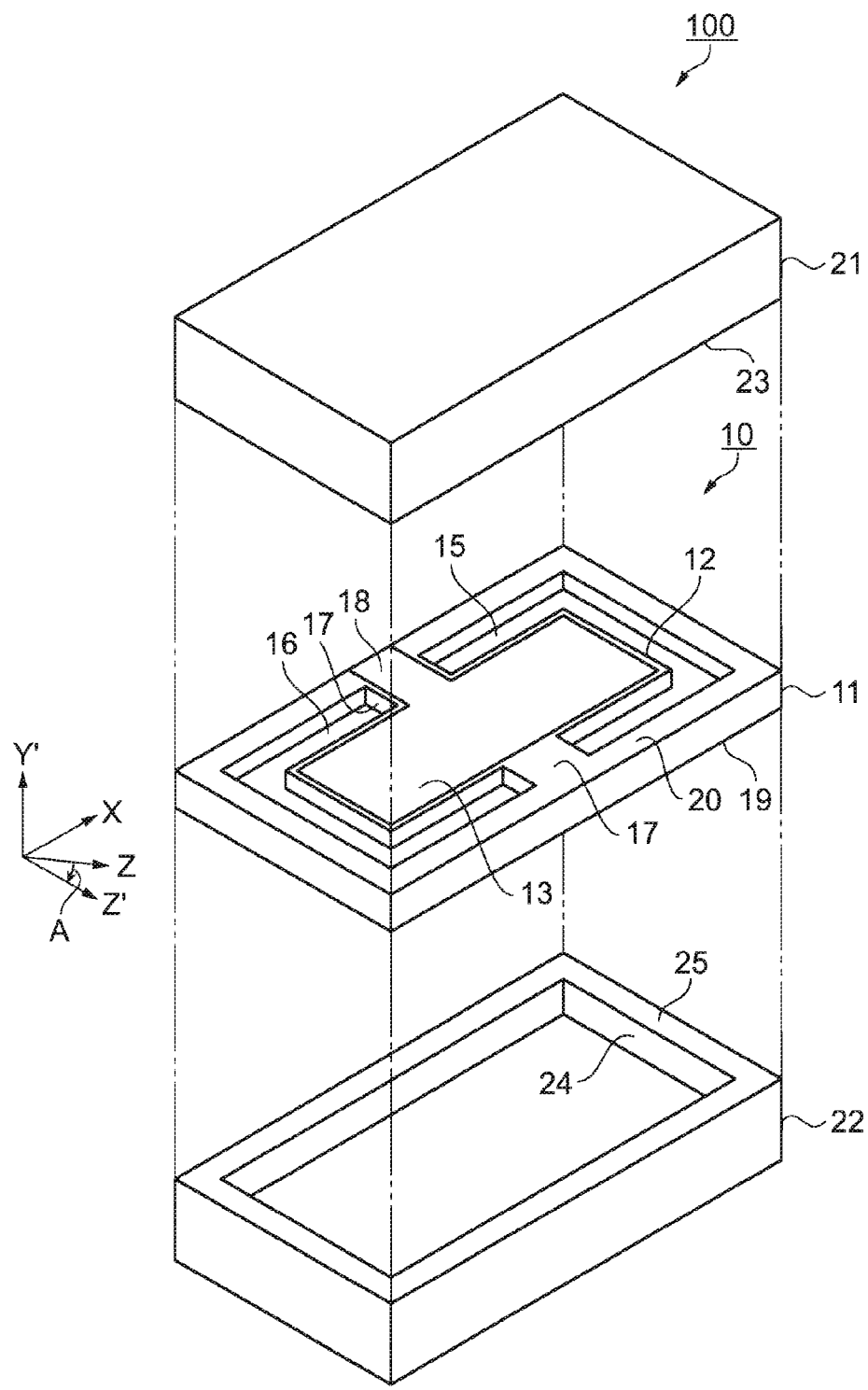
FIG. 1 is a perspective view showing an outlined structure of a quartz crystal resonator according to a first embodiment of the invention.

A quartz crystal resonator according to a first embodiment of the invention will be described by referring to FIGS. 1 and 2. FIG. 1 is a perspective view showing an outlined structure of the quartz crystal resonator according to the first embodiment, FIG. 2 is a sectional view of the quartz crystal resonator shown in FIG. 1.

Figure 2:
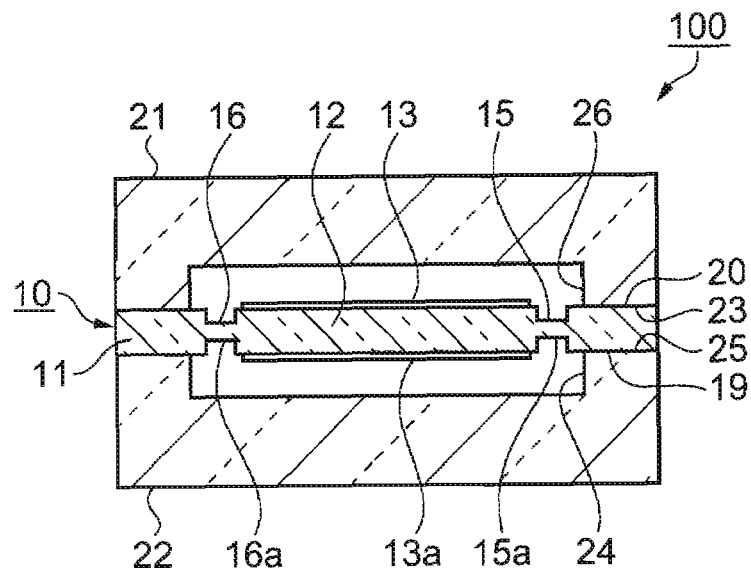
FIG. 2 is a front sectional view of the quartz crystal resonator shown in FIG. 1.

As shown in FIGS. 1 and 2, a quartz crystal resonator 100 is comprised of a quartz crystal resonator element 10, first and second casings 21 and 22 as two covers sandwiching and covering the quartz crystal resonator element 10 from upper and lower sides thereof. The quartz crystal resonator 100 having such a structure is also called a CSP (Chip Size Package) resonator.

The quartz crystal resonator element 10 is comprised of a main vibrating portion 12 integrally formed from a quartz crystal substrate and a supporting portion 11 formed peripherally so as to surround the main vibrating portion 12 in a manner including an outer peripheral edge thereof, The quartz crystal substrate is formed by cutting out a quartz crystal having crystallographic axes denoted by an X axis (electrical axis), a Y axis (mechanical axis) and a Z axis (optical axis) at a predetermined angle with respect to each of the axes. The first embodiment employs a quartz crystal substrate in which one side thereof is cut in parallel to the X axis and the other side is cut in parallel to a Z' axis of an inclination of an angle A set within a range equal to or greater than 36.4 degrees and equal to or smaller than 40.5 degrees from the Z axis around the X axis.

Between the main vibrating portion 12 and the supporting portion 11 are provided grooves 15 and 16 on an upper surface side of the quartz crystal resonator element and grooves 15a and 16a on a lower surface side thereof. The grooves 15, 16, 15a and 16a can prevent vibration leakage of the main vibrating portion 12 to the supporting portion 11. Alternatively, the grooves may be formed not on both of the upper and lower surface sides but on one of them.

On the upper and lower surfaces of the main vibrating portion 12 are formed excitation electrodes 13 and 13a, respectively. From each of the excitation electrodes 13 and 13a, a connection electrode 18 is extended onto a flat portion 17. However, a connection electrode on the lower surface side thereof is not shown in the figure. The excitation electrodes 13, 13a and the connection electrode 18 are, for example, formed by a metallic thin film having conductivity, such as a thin film of aluminum (Al), gold(Au) or silver (Ag). Such a metallic thin film may be formed, for example, by vapor deposition, sputtering or the like.

The first casing 21 is bonded to an upper surface 20 of the supporting portion 11 of the quartz crystal resonator element 10. The second casing 22 is bonded to a lower surface 19 of the supporting portion 11 thereof. The first and second casings 21 and 22 are made of a material having a thermal expansion coefficient equal to or greater than $6 \times 10^{-6}$ per degrees centigrade and equal to or smaller than $10 \times 10^{-6}$ per degrees centigrade. The first embodiment employs blue plate glass having a thermal expansion coefficient of $8.1 \times 10^{-6}$ per degrees centigrade.

The first casing 21 has a protruding portion 26 formed peripherally thereon, nearly opposing the supporting portion 11 of the quartz crystal resonator element 10. In other words, the first casing 21 has a recessed cavity at a part where the protruding portion 26 is not formed. The upper surface 20 of the supporting portion 11 is bonded to a bonded surface 23 of the protruding portion 26 of the first casing 21 so that the recessed cavity opposes the main vibrating portion 12, whereby the quartz crystal resonator element 10 is bonded to the first casing 21 by using anodic oxidation or the like.

The second casing 22 has a protruding portion 24 formed peripherally thereon, nearly opposing the supporting portion 11 of the quartz crystal resonator element 10. In other words, the second casing 22 has a recessed cavity at a part where the protruding portion 24 is not formed. The lower surface 19 of the supporting portion 11 is bonded to a bonded surface 25 of the protruding portion 24 of the second casing 22 so that the recessed cavity opposes the main vibrating portion 12, whereby the quartz crystal resonator element 10 is bonded to the second casing 22 by using anodic oxidation or the like.

Consequently, the first casing 21 is bonded to the second casing 22 in such a manner so as to sandwich the quartz crystal resonator element 10 therebetween. In this case, cavities provided by the protruding portions 26 and 24 formed on the first and second casings 21 and 22, respectively, can prevent contact between the main vibrating portion 12 of the quartz crystal resonator element 10 and the first and second casings 21 and 22. Bonding the first and second casings 21 and 22 to the supporting portion 11 allows the insides of the recessed cavities of the two casings to be sealed airtightly.

In the quartz crystal resonator 100 according to the above first embodiment, combining a cut angle of the quartz crystal resonator element 10 with the thermal expansion coefficients of the first and second casings 21 and 22 within the above-mentioned range can prevent deterioration of frequency-temperature characteristics.

Figure 12:
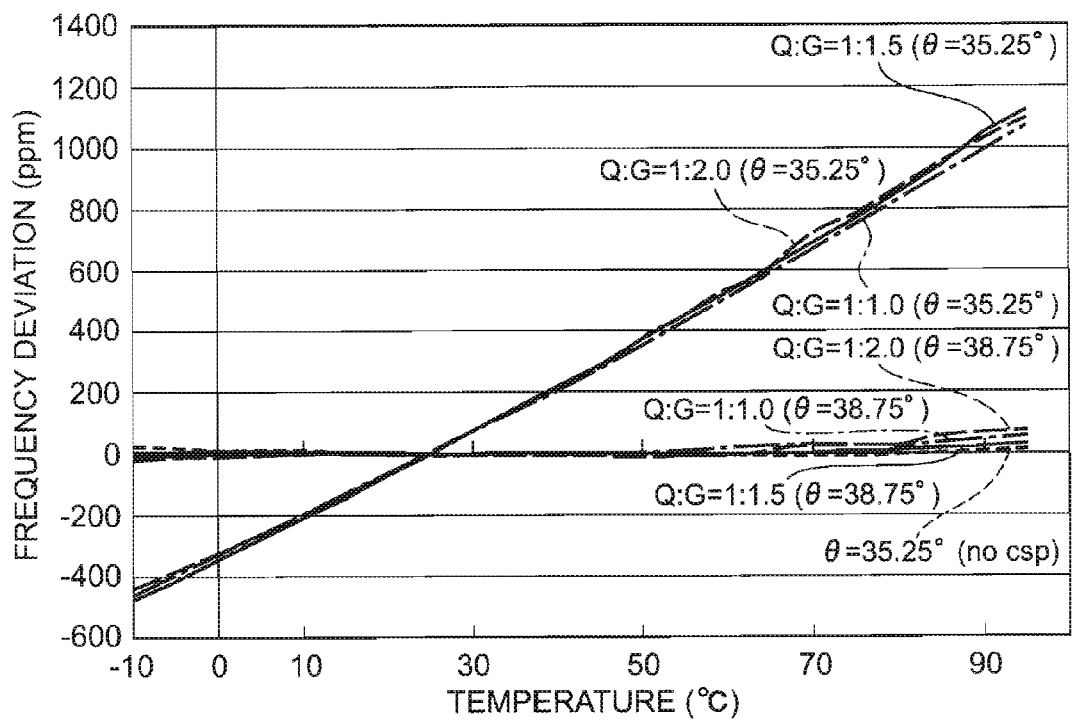
FIG. 12 is a graph showing frequency-temperature characteristics of the quartz crystal resonator according to the first embodiment.

FIG. 12 shows an example of such effectiveness. The figure shows frequency-temperature characteristics obtained when a cut angle (θ) of the quartz crystal resonator element 10 is 35.25 degrees as a well-known AT-cut angle and also 38.75 degrees as an example of the embodiment.

In the quartz crystal resonator of the first embodiment having the CSP structure with the cut angle of 38.75 degrees, almost no frequency changes are observed from −10 up to 90 degrees centigrade ($\Delta f/f = -20 \times 10^{-6} - 50 \times 10^{-6}$), where excellent frequency characteristics are shown. Similarly, the quartz crystal resonator not having the CSP structure with the well-known cut angle of 35.25 degrees also has excellent frequency characteristics. Compared with them, in a comparative example of a quartz crystal resonator having a CSP structure with the cut angle of 35.25 degrees, significant frequency changes are observed within a range from −10 to 90 degrees centigrade ($\Delta f/f = -450 \times 10^{-6} - 1100 \times 10^{-6}$).

In addition, expressions of Q:G=1:1.0, Q:G=1:1.5 and Q:G=1:2.0 shown in FIG. 12 each indicate a ratio of a thickness (Q) of the quartz crystal resonator element to a thickness (G) of the first and second casings 21 and 22. All of the thickness ratios reveal the above-described effectiveness.

In this way, the structure of the first embodiment can provide the quartz crystal resonator having excellent frequency-temperature characteristics. Furthermore, since the embodiment can use a commonly-used glass such as blue plate glass as the covers, casings for the covers can be prepared at a low cost. Use of such low-cost casings can reduce manufacturing cost of the quartz crystal resonator.

The first embodiment employs the quartz crystal substrate in which one side thereof is cut in parallel to the X axis and the other side is cut in parallel to the Z' axis having the inclination of the angle A (hereinafter referred to as "an optimal cut angle") set within the range equal to or greater than 36.4 degrees and equal to or smaller than 40.5 degrees from the Z axis around the X axis. Through repeated manufacturing of various experimental products, the inventor of the present invention has determined that there is a relationship having more favorable frequency-temperature characteristics between each of a resonance frequency and an X-side ratio of the quartz crystal resonator element 10 and an optimal cut angle thereof.

Figure 10:
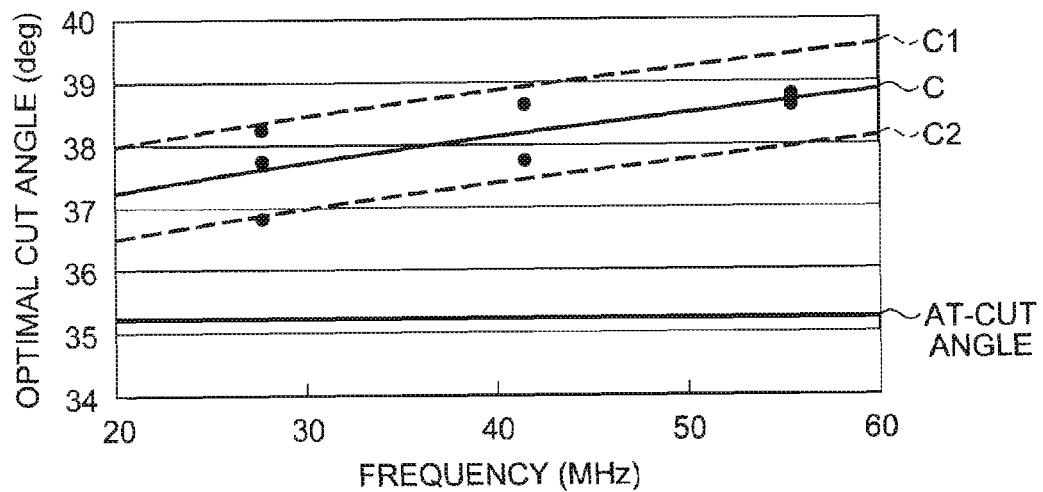
FIG. 10 is a graph showing a relationship between a resonance frequency and an optimal cut angle of the quartz crystal resonator element in the first embodiment.
Figure 11:
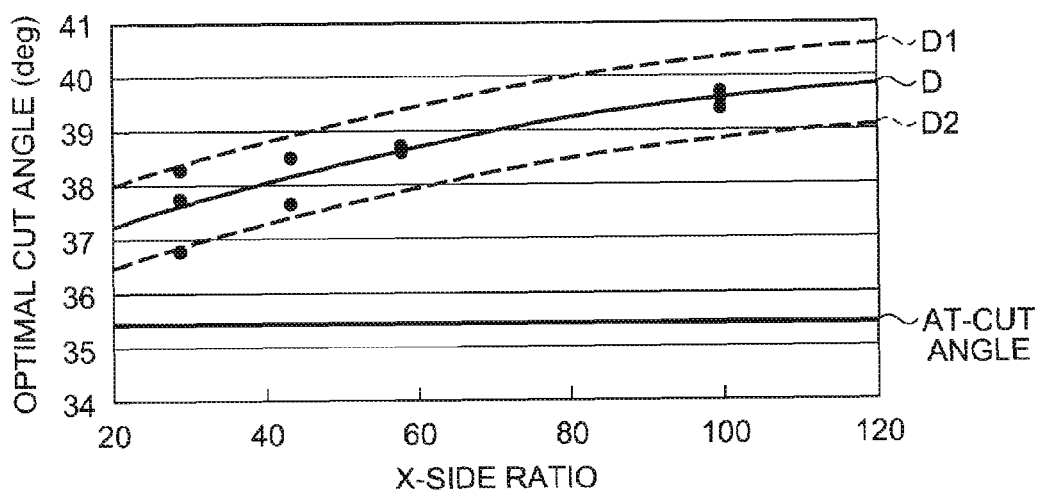
FIG. 11 is a graph showing a relationship between an X-side ratio and the optimal cut angle of the quartz crystal resonator element in the first embodiment.

The above-mentioned relationships will be described by referring to FIGS. 10 and 11. FIG. 10 is a graph showing the relationship between a resonance frequency and an optimal cut angle of the quartz crystal resonator element 10. FIG. 11 is a graph showing the relationship between the X-side ratio as a ratio of a length-to-thickness of a side parallel to the X axis of the quartz crystal resonator element 10 and an optimal cut angle.

First, a description will be given of the relationship between the resonance frequency and the optimal cut angle. In FIG. 10, the vertical axis shows the optimal cut angle (y degrees), whereas the horizontal axis shows the resonance frequency (f MHz) of the quartz crystal resonator element. In this figure, line C, which approximates the plots of optimal cut angles in respective resonance frequency bands, is expressed as a formula: $y=-1.731\times-10^{-4} f^2+5.435\times10^{-2} f+3.623\times10$. In addition to the line C, there are shown lines C1 and C2 indicating a range of ±0.75. The lines indicate the range of a most favorable relationship between the resonance frequency and an optimal cut angle of the quartz crystal resonator element 10. These results show that the most favorable relationship therebetween is expressed as a formula: $y=-1.731\times10^{-4} f^2+5.435\times10^{-2} f+3.623\times10\pm0.75$.

Here, a description will be given of the range of ×0.75. The optimal cut angle depends on the thickness of the quartz crystal substrate, as well as the thicknesses of the first and second casings 21 and 22. Accordingly, a margin of error therebetween is regarded as ±0.75 degrees. In this case, ±0.75 is equivalent to 1σ(sigma) per plotted value.

Next, a description will be given of the relationship between the X-side ratio and the optimal cut angle. In FIG. 11, the vertical axis indicates the optimal cut angle (y degrees), whereas the horizontal axis indicates the X-side ratio of the quartz crystal resonator element. In this figure, an optimal cut angle with respect to each X-side ratio is plotted and a curve D approximating the plots is expressed as a formula: $y=-2.547\times10^{-4} x^2+6.314\times10^{-2}x+3.597\times10^1$. In addition to the curve D, there are shown curves D1 and D2 indicating the range of ±0.75. These curves show the range of a most favorable relationship between the X-side ratio and the optimal cut angle.

Consequently, the optimal range therebetween is expressed as a formula: $y=-2.547\times10^{-4} x^2+6.314\times10^{-2}x+3.597\times10^1\pm0.75$. Here, the range of ±0.75 is the same as that in the previous description and thus is omitted.

Figure 3:
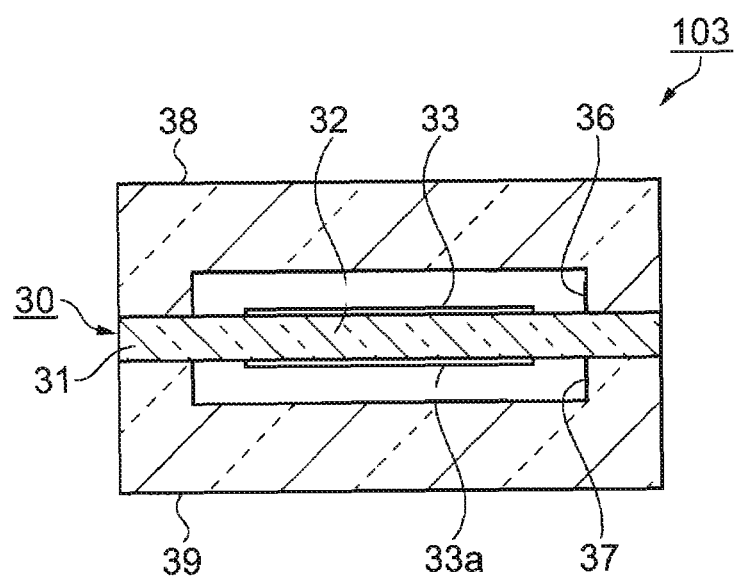
FIG. 3 is a front sectional view showing a modified example 1 of the first embodiment.
Figure 4:
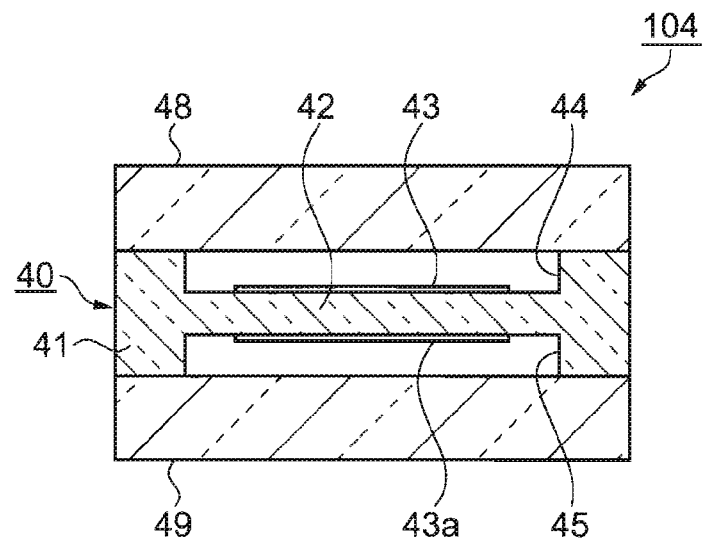
FIG. 4 is a front sectional view of a modified example 2 of the first embodiment.
Figure 5:
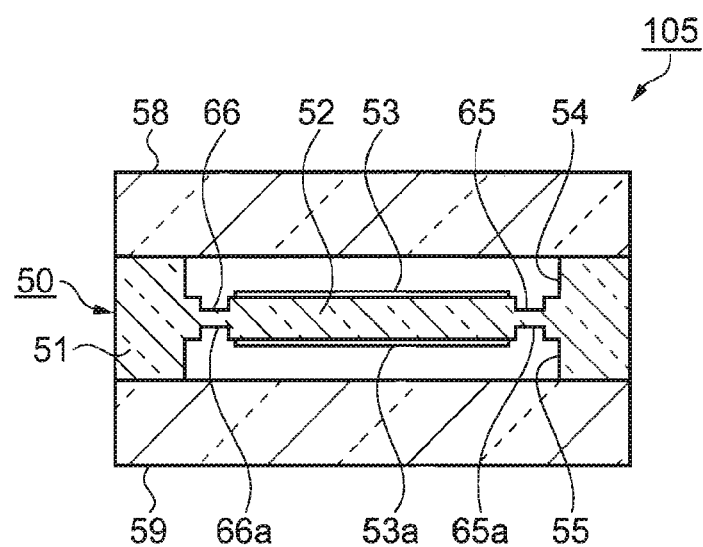
FIG. 5 is a front sectional view showing a modified example 3 of the first embodiment.

Next, modified examples of the first embodiment will be described by referring to FIGS. 3 to 5. FIG. 3 is a sectional view showing a modified example 1 of the first embodiment. FIG. 4 is a sectional view showing a modified example 2 of the first embodiment. FIG. 5 is a sectional view showing a modified example 3 of the first embodiment. Here, the same descriptions of the quartz crystal substrate and the first and second casings as those in the first embodiment will be omitted.

MODIFIED EXAMPLE 1

As shown in FIG. 3, a quartz crystal resonator 103 is comprised of a quartz crystal resonator element 30, first and second casings 38 and 39 as two covers sandwiching and covering the quartz crystal resonator element 30 from upper and lower sides thereof.

The quartz crystal resonator element 30 is comprised of a main vibrating portion 32 integrally formed from a quartz crystal substrate and a supporting portion 31 formed peripherally so as to surround the main vibrating portion 32 in a manner including an outer peripheral edge thereof. The quartz crystal resonator element 30 has a roughly plate shape. On upper and lower surfaces of the main vibrating portion 32 including a center part of the quartz crystal resonator element 30 are formed excitation electrodes 33 and 33a.

The first casing 38 is bonded to an upper surface of the supporting portion 31 of the quartz crystal resonator element 30. The second casing 39 is bonded to a lower surface thereof. The first casing 38 has a peripherally-formed protruding portion 36 nearly opposing the supporting portion 31 of the quartz crystal resonator element 30. The second casing 39 has a peripherally-formed protruding portion 37 nearly opposing the supporting portion 31 thereof. Other structures of the first and second casings 38 and 39, as well as a method for bonding them to the quartz crystal resonator element 30 are the same as those in the first embodiment and thus will not be described below.

MODIFIED EXAMPLE 2

As shown in FIG. 4, a quartz crystal resonator 104 is comprised of a quartz crystal resonator element 40, first and second casings 48 and 49 as two covers sandwiching and covering the quartz crystal resonator element 40 from upper and lower sides thereof.

The quartz crystal resonator element 40 is comprised of a main vibrating portion 42 integrally formed from a quartz crystal substrate and a supporting portion 41 formed peripherally so as to surround the main vibrating portion 42 in a manner including an outer peripheral edge thereof. The supporting portion 41 forms a periphery of the quartz crystal resonator element 40 in a manner including an outer peripheral edge thereof. There are provided an upper-surface-side protruding portion 44 and a lower-surface-side protruding portion 45, respectively, protruding in a thickness direction from the upper and lower surfaces of the main vibrating portion 42. Excitation electrodes 43 and 43a are formed, respectively, on the upper and lower surfaces of the main vibrating portion 42 including a center part of the quartz crystal resonator element 40. The first casing 48 is bonded to an upper surface of the supporting portion 41 of the quartz crystal resonator element 40, and the second casing 49 is bonded to a lower surface thereof. The first and second casings 48 and 49 are made of plane glass.

MODIFIED EXAMPLE 3

As shown in FIG. 5, a quartz crystal resonator 105 is comprised of a quartz crystal resonator element 50, first and second casings 58 and 59 as two covers sandwiching and covering the quartz crystal resonator element 50 from upper and lower sides thereof.

The quartz crystal resonator element 50 is comprised of a main vibrating portion 52 integrally formed from a quartz crystal substrate and a supporting portion 51 formed peripherally so as to surround the main vibrating portion 52 in a manner including an outer peripheral edge thereof. Between the main vibrating portion 52 and the supporting portion 51 are provided recessed grooves 65 and 66 on an upper surface side of the quartz crystal resonator element 50 and recessed grooves 65a and 66a on a lower surface side thereof. The supporting portion 51 forms a periphery of the quartz crystal resonator element 50 including an outer peripheral edge thereof. There are provided an upper-surface-side protruding portion 54 and a lower-surface-side protruding portion 55, respectively, protruding in a thickness direction from the upper and lower surfaces of the main vibrating portion 52. Excitation electrodes 53 and 53a are formed, respectively, on the upper and lower surfaces of the main vibrating portion 52 including a center part of the quartz crystal resonator element 50. The first casing 58 is bonded to an upper surface of the supporting portion 51 of the quartz crystal resonator element 50. The second casing 59 is bonded to a lower surface of the supporting portion 51 thereof. The first and second casings 58 and 59 are made of plane glass.

The quartz crystal resonators 103, 104 and 105 in the modified examples 1 to 3 described above have the same effectiveness as those in the first embodiment.

SECOND EMBODIMENT

Figure 6:
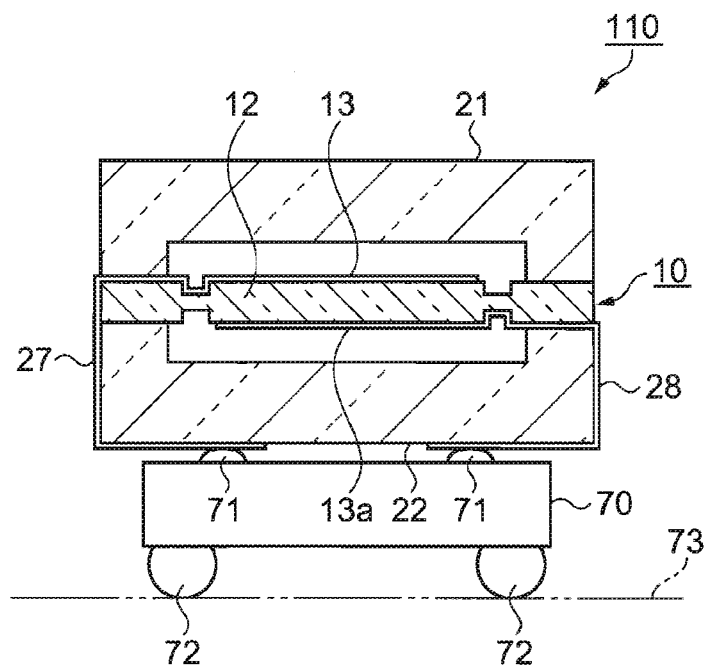
FIG. 6 is a front sectional view showing an outlined structure of a quartz crystal resonator according to a second embodiment of the invention.

A quartz crystal resonator according to a second embodiment of the invention will be described by referring to FIG. 6. FIG. 6 is a sectional view showing an outlined structure of the quartz crystal resonator according to the second embodiment.

As shown in FIG. 6, a quartz crystal resonator 110 is comprised of a quartz crystal resonator element 10, first and second casings 21 and 22 as two covers sandwiching and covering the quartz crystal resonator element 10 from upper and lower sides thereof and a circuit section 70 provided on a surface of the second casing 22. Here, the quartz crystal resonator 110 and the first and second casings 21 and 22 have the same structures as those in the first embodiment and thus are given the same numerals to omit explanation thereof.

The circuit section 70 is comprised of a semiconductor circuit element, etc., and at least serves to oscillate the quartz crystal resonator 110. The circuit section 70 is, for example, extended from the excitations 13 and 13a of the quartz crystal resonator element 10 by a connection pad 71 such as an Au bump to be connected to connection electrodes 27 and 28 formed on an outer surface of the second casing 22. In this situation, the circuit section 70 is arranged so as to overlap the second casing 22 in a plane view to be connected thereto.

The circuit section 70, which also serves to supply a power source and input/output signals, is connected to a circuit substrate 73 as a connected unit by a connector 72 made of a material such as solder. Consequently, the quartz crystal resonator 110 including the circuit section 70 will be connected to the circuit substrate 73.

The quartz crystal resonator 110 of the second embodiment described above has the structure in which the quartz crystal resonator element 10 is integrally connected to the circuit section 70 so as to overlap each other in the plane view. In this manner, in addition to the effectiveness of the quartz crystal resonator 100 in the above first embodiment, the quartz crystal resonator 110 can equip the circuit section therewith without an increase in an area of the plane view. That is, the quartz crystal resonator 110 can be connected to a circuit section without increasing an area for mounting a circuit section on a circuit substrate.

Figure 7:
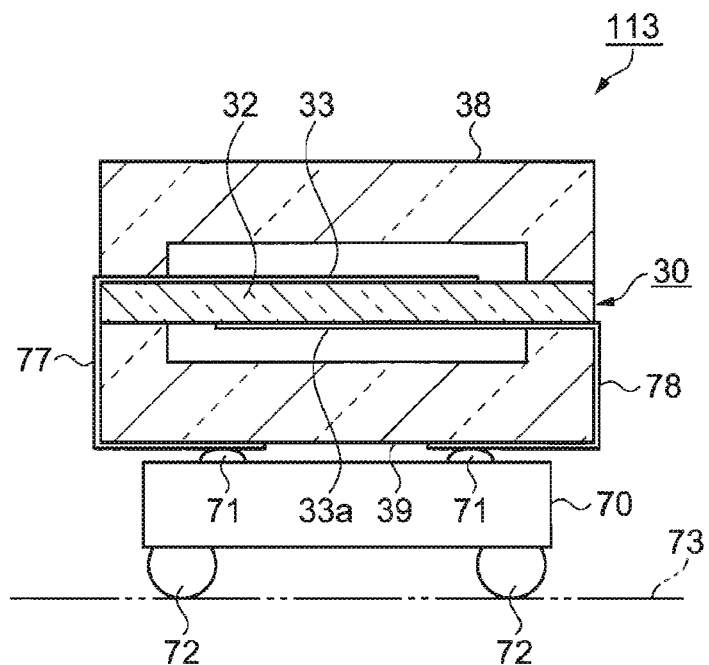
FIG. 7 is a front sectional view showing a modified example 1 of the second embodiment.
Figure 8:
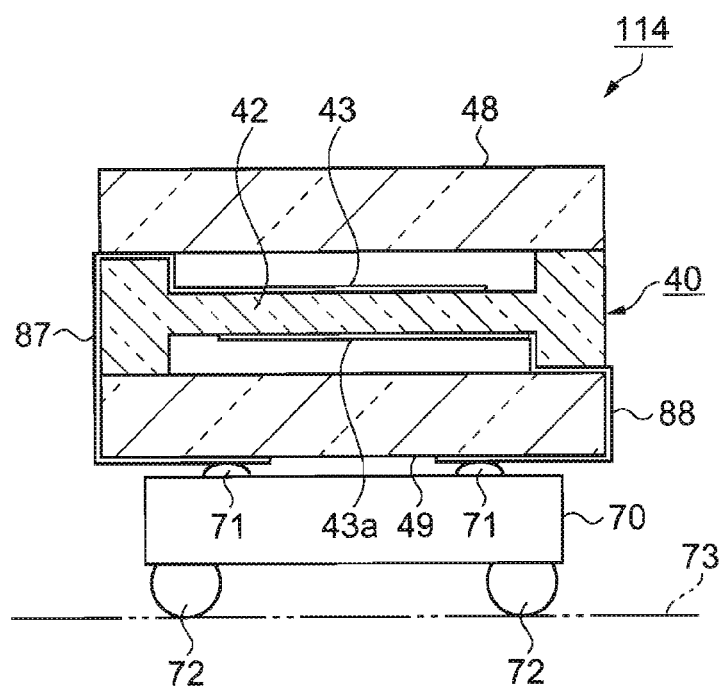
FIG. 8 is a front sectional view showing a modified example 2 of the second embodiment.
Figure 9:
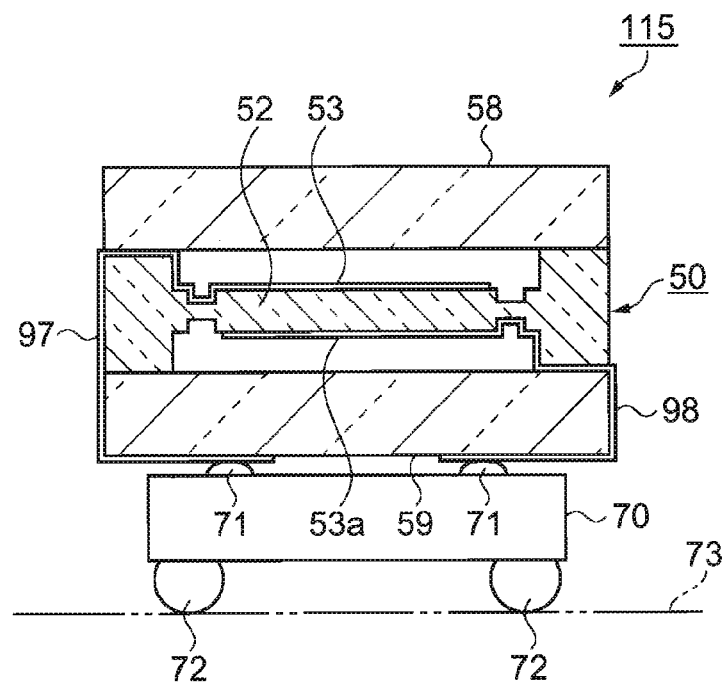
FIG. 9 is a front sectional view showing a modified example 3 of the second embodiment.

Next, modified examples of the second embodiment will be described by referring to FIGS. 7 to 9. FIG. 7 is a sectional view showing a modified example 1 of the second embodiment. FIG. 8 is a sectional view showing a modified example 2 of the second embodiment. FIG. 9 is a sectional view showing a modified example 3 of the second embodiment. Here, regarding the quartz crystal resonator and the first and second casings, the same descriptions as those in the second embodiment will be omitted.

MODIFIED EXAMPLE 1

As shown in FIG. 7, a quartz crystal resonator 113 is comprised of the quartz crystal resonator element 30, the first and second casings 38 and 39 as two covers sandwiching and covering the quartz crystal resonator element 30 from upper and lower sides thereof and the circuit section 70 provided on a surface of the second casing 39. Here, the quartz crystal resonator 113, the first and second casings 38 and 39 have the same structures as those of the modified example 1 in the first embodiment and thus are given the same numerals to omit explanation thereof The circuit section 70 is comprised of a semiconductor circuit element, etc. and at least serves to oscillate the quartz crystal resonator 113. The circuit section 70 is, for example, extended from the excitations 33 and 33a of the quartz crystal resonator element 30 by the connection pad 71 such as an Au bump to be connected to connection electrodes 77 and 78 extendedly provided on an outer surface of the second casing 39. In this situation, the circuit section 70 is arranged so as to overlap the second casing 39 in a plane view to be connected thereto.

The circuit section 70, which also serves to supply a power source and input/output signals, is connected to the circuit substrate 73 as a connected unit by the connector 72 made of a material such as solder. Consequently, the quartz crystal resonator 113 including the circuit section 70 will be connected to the circuit substrate 73.

MODIFIED EXAMPLE 2

As shown in FIG. 8, a quartz crystal resonator 114 is comprised of the quartz crystal resonator element 40, the first and second casings 48 and 49 as two covers sandwiching and covering the quartz crystal resonator element 40 from upper and lower sides thereof and the circuit section 70 provided on a surface of the second casing 49. Here, the quartz crystal resonator 114, the first and second casings 48 and 49 have the same structures as those of the modified example 2 in the first embodiment and thus are given the same numerals to omit explanation thereof.

The circuit section 70 is comprised of a semiconductor circuit element, etc. and at least serves to oscillate the quartz crystal resonator 114. The circuit section 70 is, for example, extended from the excitations 43 and 43a of the quartz crystal resonator element 40 by the connection pad 71 such as an Au bump to be connected to connection electrodes 87 and 88 extendedly provided on an outer surface of the second casing 49, In this situation, the circuit section 70 is arranged so as to overlap the second casing 49 in a plane view to be connected thereto.

The circuit section 70, which also serves to supply a power source and input/output signals, is connected to the circuit substrate 73 as a connected unit by the connector 72 made of a material such as solder. Consequently, the quartz crystal resonator 114 including the circuit section 70 will be connected to the circuit substrate 73.

MODIFIED EXAMPLE 3

As shown in FIG. 9, a quartz crystal resonator 116 is comprised of the quartz crystal resonator element 50, the first and second casings 58 and 59 as two covers sandwiching and covering the quartz crystal resonator element 50 from upper and lower sides thereof and the circuit section 70 provided on a surface of the second casing 59. Here, the quartz crystal resonator 115, the first and second casings 58 and 59 have the same structures as those of the modified example 3 in the first embodiment and thus are given the same numerals to omit explanation thereof.

The circuit section 70 is comprised of a semiconductor circuit element, etc. and at least serves to oscillate the quartz crystal resonator 115. The circuit section 70 is, for example, extended from the excitation electrodes 53 and 53a of the quartz crystal resonator element 50 by the connection pad 71 such as an Au bump to be connected to connection electrodes 97 and 98 extendedly provided on an outer surface of the second casing 59. In this situation, the circuit section 70 is arranged so as to overlap the second casing 59 in a plane view to be connected thereto.

The circuit section 70, which also serves to supply a power source and input/output signals, is connected to the circuit substrate 73 as a connected unit by the connector 72 made of material such as solder. Consequently, the quartz crystal resonator 115 including the circuit section 70 will be connected to the circuit substrate 73.

The quartz crystal resonators 113, 114 and 115 in the modified examples 4 to 6 described above have the same effectiveness as those in the second embodiment.

In addition, the first and second embodiments above have provided the examples using blue plate glass as the first and second casings. However, the material of the casings is not limited to that. It is only necessary that the first and second casings be made of a material having a thermal expansion coefficient equal to or greater than $6 \times 10^{-6}$ per degrees centigrade and equal to or smaller than $10 \times 10^{-6}$ per degrees centigrade. As examples of the material of the casings, there may be mentioned an alumina sintered substrate, a sapphire substrate, a chrome substrate, a titanium substrate, a platinum substrate, a tantalum substrate or the like.

ACTUAL EXAMPLE 1

Quartz crystal resonators having a resonance frequency of 40 MHz were constructed. A quartz crystal substrate used was made of each of three kinds of substrates obtained by cutting out at cut angles of inclinations of 38.5, 38.625 and 38.75 degrees from a Z axis around an X axis. Each quartz crystal resonator element had grooves surrounding a main vibrating portion and a peripherally-formed supporting portion with a thickness of 100 μm. The shape of the quartz crystal resonator element was a rectangular in which a side length thereof in an X direction was approximately 1750 μm and a side length thereof in a Z' direction was approximately 1250 μm, with a thickness of approximately 41.75 μm for the main vibrating portion. Here, the X-side ratio (1750:41.75) of the example was approximately 41.9.

As a comparative example, there was used a quartz crystal resonator element having the well-known AT-cut angle of 35.25 degrees and the same shape as described above.

The first and second casings were made of blue plate glass having a thermal expansion coefficient of $8.1 \times 10^{-6}$ per degrees centigrade and a thickness of approximately 200 μm. The main vibrating portion of each quartz crystal resonator element had excitation electrodes on upper and lower surfaces thereof. The first and second casings were bonded at the supporting portion by anodic oxidation to construct the quartz crystal resonator.

Figure 13:
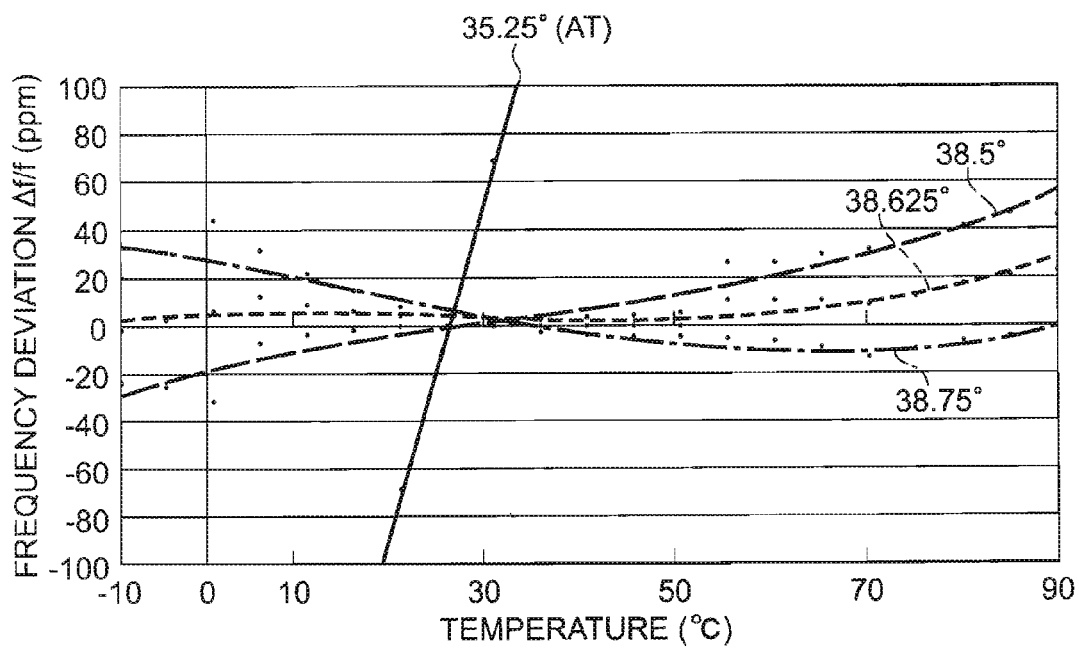
FIG. 13 is a graph showing frequency-temperature characteristics of a quartz crystal resonator of actual example 1.

FIG. 13 shows frequency-temperature characteristics of each of the constructed quartz crystal resonators. As shown in the figure, regarding the AT-cut resonator with an angle of 35.25 degrees prepared as the comparative example, there is shown a graphic line rising extremely steeply, which indicates poor frequency-temperature characteristics. In contrast to this, regarding the frequency-temperature characteristics of the three quartz crystal resonators (cut angles: 38.5, 38.625 and 38.75 degrees) in the actual example 1, their graphic inclinations are gentle, thereby indicating favorable results.

ACTUAL EXAMPLE 2

Quartz crystal resonators constructed had a resonance frequency of 56 MHz. As a quartz crystal substrate for each, there were provided four kinds of substrates obtained by cutting out at cut angles of inclinations of 38.0, 38.25, 38.75 and 39.0 degrees from a Z axis around an X axis. A quartz crystal resonator element had grooves surrounding a main vibrating portion and a peripherally-formed supporting portion with a thickness of 100 μm. The shape of the resonator element was a rectangular in which a side length thereof in an X direction was approximately 1,700 μm and a side length thereof in a Z' direction was approximately 1,200 μm, with a thickness of approximately 29.8 μm for the main vibrating portion. In addition, the X-side ratio (1700:29.8) of the example was approximately 57.05.

As comparative examples, there were used quartz crystal resonator elements having the well-known AT-cut angle of 35.25 degrees and a cut angle of 36.0 degrees, which falls outside the optimal cut-angle range of the present invention, with the same shape as described above.

The first and second casings were made of blue plate glass having a thermal expansion coefficient of $8.1 \times 10^{-6}$ per degrees centigrade and a thickness of approximately 200 μm. The main vibrating portion of each quartz crystal resonator element had excitation electrodes on upper and lower surfaces thereof. The first and second casings were bonded at the supporting portion by anodic oxidation to construct the quartz crystal resonator.

Figure 14:
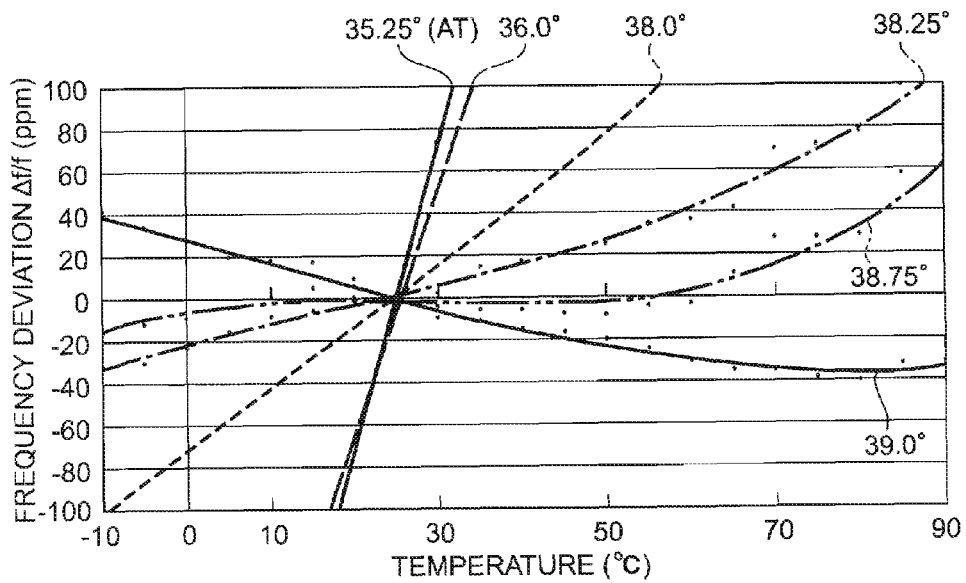
FIG. 14 is a graph showing frequency-temperature characteristics of a quartz crystal resonator of actual example 2.

FIG. 14 shows frequency-temperature characteristics of each of the constructed quartz crystal resonators. As shown in the figure, regarding the AT-cut resonator with the angle of 35.25 degrees and the quartz crystal resonator with the cut angle of 36.0 degrees prepared as the comparative examples, their graphic lines are rising extremely steeply. In contrast to them, in the frequency-temperature characteristics of the four quartz crystal resonators (cut angles: 38.0, 38.25, 38.75 and 39.0 degrees) in the actual example 2, their graphic inclinations are gentle, thereby indicating favorable results. Particularly, in the characteristics of the quartz crystal resonators having the cut angles of 38.75 and 39.0 degrees near the line C expressed as the formula: $y=-1.731 \times -10^{-4} f^2 + 5.435 \times 10^{-2} f + 3.623 \times 10$ as shown in FIG. 10, there are shown significantly gentle inclinations, which indicates favorable results.

ACTUAL EXAMPLE 3

Frequency-temperature characteristics were determined by a ratio of a thickness (Q) of the quartz crystal resonator element to a thickness (G) of the first and second casings.

In the actual example, quartz crystal resonators having a resonance frequency of 56 MHz were constructed. A quartz crystal substrate used was a substrate obtained by cutting at a cut angle of an inclination of 38.75 degrees from a Z axis around an X axis. A quartz crystal resonator element had grooves surrounding a main vibrating portion and a peripherally-formed supporting portion with a thickness of 100 μm. The shape of the resonator element was a rectangular in which a side length thereof in an X direction was approximately 1700 μm and a side length thereof in a Z' direction was approximately 1200 μm, with a thickness of approximately 29.8 μm for the main vibrating portion.

As a comparative example, there was used a quartz crystal resonator element having the well-known AT-cut angle of 35.25 degrees and the same shape as described above.

Using each quartz resonator element and first and second casings made of blue plate glass having a thermal expansion coefficient of $8.1 \times 10^{-6}$ per degrees centigrade, there were constructed quartz crystal resonators, each of which having a different thickness of the blue plate glass to investigate frequency-temperature characteristics thereof. As the ratio of Q to G, there were prepared three kinds of ratios of 1:1, 0.1:1.5 and 1:2.0. In addition, the Q-to-G ratio of the AT-cut quartz crystal resonator as the comparative example was set to be 1:1.0.

Figure 15:
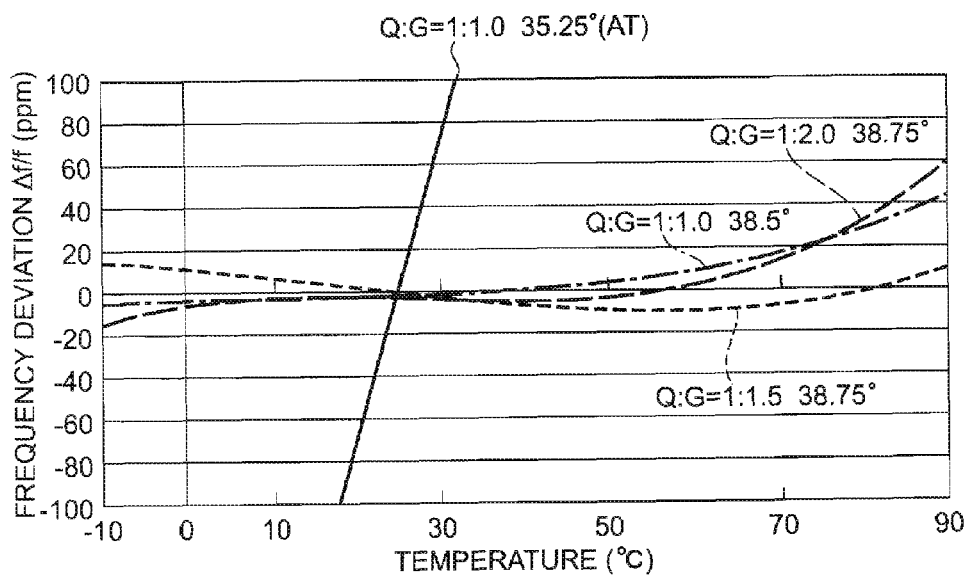
FIG. 15 is a graph showing frequency-temperature characteristics of a quartz crystal resonator of actual example 3.
Figure 16:
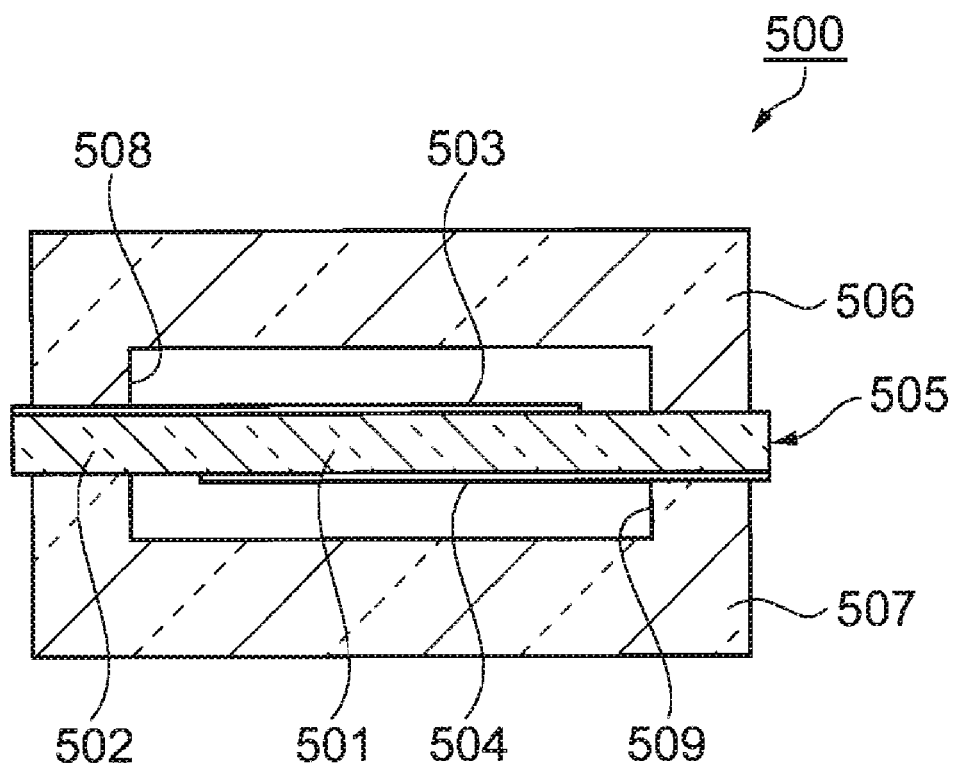
FIG. 16 is a sectional view showing a CSP quartz crystal resonator using a well-known AT-cut resonator element.

FIG. 15 shows frequency-temperature characteristics of the prepared quartz crystal resonators. As shown in the figure, regarding the AT-cut resonator with an angle of 35.25 degrees as the comparative example, its graphic line is rising extremely steeply. In contrast to that, in the frequency-temperature characteristics of the quartz crystal resonators having the three Q-to-G ratios in the actual example 3, their graphic inclinations are gentle, indicating favorable results in all of the quartz crystal resonators.

Although the present invention and its advantages have been described in detail, it should be understood that various changes, substitutions and alterations can be made herein without departing from the spirit and scope of the invention as defined by the appended claims.

What is claimed is:

1. A quartz crystal resonator, comprising:
   a quartz crystal resonator element having a main surface including an X axis (electrical axis) and a Z' axis of an inclination rotated at an angle (y) equal to or greater than 36.4 degrees and equal to or smaller than 40.5 degrees from a Z axis (optical axis) around the X axis, a main vibrating portion vibrating at a predetermined resonance frequency (f) and a supporting portion integrally formed with the main vibrating portion in such a manner as to be formed peripherally to surround the main vibrating portion;
   two covers having a thermal expansion coefficient equal to or greater than $6 \times 10^{-6}$ per degrees centigrade and equal to or smaller than $10 \times 10^{-6}$ per degrees centigrade and bonded to the supporting portion so as to sandwich the quartz crystal resonator element therebetween;
   a circuit section, which is disposed under a lower cover and is electrically connected with the quartz crystal resonator element; and
   a circuit substrate, which is located under the circuit section.

2. The quartz crystal resonator according to claim 1, each of the two covers having a protruding portion formed peripherally thereon in such a manner as roughly oppose the supporting portion, the protruding portion being bonded to the supporting portion.

3. The quartz crystal resonator according to claim 2, the circuit section including an oscillation circuit for the quartz crystal resonator element is provided on a surface of at least one of the two covers to be connected to the quartz crystal resonator element.

4. The quartz crystal resonator according to claim 1, the supporting portion has a protrusion formed so as to be protruded from the main surface at each of upper and lower sides of the resonator element, an upper surface of the protrusion being bonded to each of the two covers.

5. The quartz crystal resonator according to claim 4, the circuit section including an oscillation circuit for the quartz crystal resonator element being provided on a surface of at least one of the two covers to be connected to the quartz crystal resonator element.

6. The quartz crystal resonator according to claim 1, the quartz crystal resonator element having a recessed groove formed on at least one main surface thereof in such a manner as to surround the main vibrating portion.

7. The quartz crystal resonator according to claim 6, the circuit section including an oscillation circuit for the quartz crystal resonator element being provided on a surface of at least one of the two covers to be connected to the quartz crystal resonator element.

8. The quartz crystal resonator according to claim 1, a relationship between the angle (y) and the resonance frequency (f) being expressed as a formula: $y=-1.731\times10^{-4}f^2+5.435\times10^{-2}f+3.623\times10\pm0.75$.

9. The quartz crystal resonator according to claim 1, a relationship between the angle (y) and an X-side ratio (x) as a length-to-thickness ratio of a side roughly along the X axis is expressed as a formula: $y=-2.547\times10^{-4}x^2+6.314\times10^{-2}x+3.597\times10^1\pm0.75$.

10. A quartz crystal resonator, comprising:
    a quartz crystal resonator element having a main surface including an X axis (electrical axis) and a Z' axis of an inclination rotated at an angle (y) equal to or greater than 36.4 degrees and equal to or smaller than 40.5 degrees from a Z axis (optical axis) around the X axis, a main vibrating portion vibrating at a predetermined resonance frequency (f) and a supporting portion integrally formed with the main vibrating portion in such a manner as to be formed peripherally to surround the main vibrating portion;
    two covers having a thermal expansion coefficient equal to or greater than $6 \times 10^{-6}$ per degrees centigrade and equal to or smaller than $10 \times 10^{-6}$ per degrees centigrade and bonded to the supporting portion so as to sandwich the quartz crystal resonator element therebetween:
    a circuit section, which is disposed under a lower cover and is electrically connected with the quartz crystal resonator element; and
    a circuit substrate, which is located under the circuit section,
    the quartz crystal resonator element having a first recessed groove and a second recessed groove formed on at least one main surface, and
    each of the first recessed groove and the second recessed groove having three sides, each of the three sides of the first recessed groove and the three sides of the second recessed groove extending around the main vibrating portion.

* * * * *